(12) United States Patent
Fang et al.

(10) Patent No.: US 11,686,637 B2
(45) Date of Patent: Jun. 27, 2023

(54) SILICON CARBIDE-BASED COMBINED TEMPERATURE-PRESSURE MICRO-ELECTRO-MECHANICAL SYSTEM (MEMS) SENSOR CHIP AND PREPARATION METHOD THEREOF

(71) Applicant: XI'AN JIAOTONG UNIVERSITY, Xi'an (CN)

(72) Inventors: Xudong Fang, Xi'an (CN); Ziyan Fang, Xi'an (CN); Chen Wu, Xi'an (CN); Hao Sun, Xi'an (CN); Libo Zhao, Xi'an (CN); Bian Tian, Xi'an (CN); Zhuangde Jiang, Xi'an (CN); Wubin Deng, Xi'an (CN); Bonan Gao, Xi'an (CN); Junxia Wu, Xi'an (CN); Songli Wang, Xi'an (CN); Nan Zhu, Xi'an (CN)

(73) Assignee: XI'AN JIAOTONG UNIVERSITY, Xi'an (CN)

( * ) Notice: Subject to any disclaimer, the term of this patent is extended or adjusted under 35 U.S.C. 154(b) by 0 days.

(21) Appl. No.: 17/583,392

(22) Filed: Jan. 25, 2022

(65) Prior Publication Data
US 2022/0146352 A1 May 12, 2022

(30) Foreign Application Priority Data
Jun. 22, 2021 (CN) .......................... 202110694517.5

(51) Int. Cl.
*G01L 9/00* (2006.01)
*B81B 7/02* (2006.01)

(52) U.S. Cl.
CPC ................. *G01L 9/005* (2013.01); *B81B 7/02* (2013.01); *G01L 9/0054* (2013.01); *B81B 2201/0264* (2013.01); *B81B 2201/0278* (2013.01)

(58) Field of Classification Search
None
See application file for complete search history.

(56) References Cited

U.S. PATENT DOCUMENTS 7,379,629 B1 * 5/2008 Burns .................. G02B 6/4202
385/32
7,434,476 B2 * 10/2008 Tang ...................... G01Q 20/04
73/777

(Continued)

FOREIGN PATENT DOCUMENTS

CN 102012288 A 4/2011
CN 109724721 A 5/2019

*Primary Examiner* — Octavia Davis Hollington
*Assistant Examiner* — Jermaine L Jenkins

(57) ABSTRACT

A silicon carbide-based micro-electro-mechanical system (MEMS) combined temperature-pressure sensor chip and a preparation thereof. The chip includes a peripheric pressure-measuring unit and a center temperature-measuring unit. The pressure-measuring unit includes a silicon carbide substrate with a raised island and a pressure sensitive diaphragm formed by etching the back of the substrate. The raised island and the pressure-sensitive diaphragm constitute a membrane-island structure. Four piezoresistive strips are arranged symmetrically along a circumferential direction of a root of the pressure-sensitive diaphragm and between the raised island and the pressure-sensitive diaphragm. The temperature-measuring unit includes the raised island and a thin-film thermocouple arranged thereon.

9 Claims, 4 Drawing Sheets

(56) References Cited

U.S. PATENT DOCUMENTS 10,876,903 B2 * 12/2020 Tu .......................... G01J 5/045
11,067,422 B2 * 7/2021 Udrea ..................... G01F 1/698

* cited by examiner

SILICON CARBIDE-BASED COMBINED TEMPERATURE-PRESSURE MICRO-ELECTRO-MECHANICAL SYSTEM (MEMS) SENSOR CHIP AND PREPARATION METHOD THEREOF

CROSS-REFERENCE TO RELATED APPLICATIONS

This application claims the benefit of priority from Chinese Patent Application No. 202110694571.5, filed on Jun. 22, 2021. The content of the aforementioned application, including any intervening amendments thereto, is incorporated herein by reference in its entirety.

TECHNICAL FIELD

This application relates to micro-electro-mechanical system (MEMS) sensors, and more specifically to a silicon carbide-based combined temperature-pressure MEMS sensor chip and a preparation method thereof.

BACKGROUND

In the fields of aerospace, geothermal development and gas turbines, higher requirements are put forward for the measurement of pressure and temperature in high-temperature environment. Especially in the combustion chambers of aero engines and gas turbines, the real-time measurement of pressure and temperature is essential for monitoring engine performance, improving combustion efficiency, and reforming and optimizing the engine structure. At present, the pressure and temperature under a high-temperature condition are often measured separately by a high-temperature pressure sensor and a temperature sensor, which causes high chip manufacturing cost, large space occupation, and complicated arrangement of lead wires. Due to limitations of material property, the temperature resistance of the current mainstream silicon-based pressure sensors generally does not exceed 300° C. An additional cooling device is required for the combustion chamber where the temperature generally exceeds 500° C. With the development of MEMS technology, integrated temperature and pressure sensors have emerged, but most of them are divided into two units to measure temperature and pressure respectively, which leads to poor chip utilization rate. Moreover, limited by the properties of silicon-based materials, the existing pressure sensors cannot be applied in a relatively high temperature.

SUMMARY

In order to overcome the above technical shortcomings in the prior art, the present disclosure provides a silicon carbide-based combined temperature-pressure micro-electro-mechanical system (MEMS) sensor chip with desirable high-temperature resistance and miniaturized structure, and a preparation method thereof. This application can satisfy the simultaneous measurement of temperature and pressure under a high temperature environment.

The technical solutions of the present disclosure are described as follows.

In a first aspect, this application provides a silicon carbide-based combined temperature-pressure MEMS sensor chip, comprising:

a pressure measuring unit; and
a temperature measuring unit;

wherein the pressure measuring unit and the temperature measuring unit are integrated on the silicon carbide-based combined temperature-pressure MEMS sensor chip;

the pressure measuring unit comprises a silicon carbide substrate and an insulating layer arranged on the silicon carbide substrate; the insulating layer is provided with a metal ohmic contact circuit; a cavity is arranged on a back side of the silicon carbide substrate; a front side of the silicon carbide substrate with the cavity is configured as a pressure-sensitive diaphragm; a raised island is arranged above the front side of the silicon carbide substrate; the raised island is configured as a substrate of the temperature measuring unit; four piezoresistive strips are arranged along a circumferential direction of a root of the pressure-sensitive diaphragm, and arranged between the raised island and the pressure-sensitive diaphragm; and the four piezoresistive strips are connected through the metal ohmic contact circuit to form a Wheatstone bridge; and the temperature measuring unit comprises the raised island, a thin-film thermocouple positive electrode and a thin-film thermocouple negative electrode; the thin-film thermocouple positive electrode and the thin-film thermocouple negative electrode are arranged on the raised island; a head of the thin-film thermocouple positive electrode and a head of the thin-film thermocouple negative electrode are overlapped to form a hot junction; an end pin of the thin-film thermocouple positive electrode and an end pin of the thin-film thermocouple negative electrode constitute a cold end; and the cold end is connected to an external circuit through a metal lead.

In an embodiment, an upper end surface of the raised island is higher than an upper end surface of the insulating layer.

In an embodiment, a length of the thin-film thermocouple positive electrode is equal to a length of the thin-film thermocouple negative electrode.

In an embodiment, the thin-film thermocouple positive electrode and the thin-film thermocouple negative electrode both have a tortuous structure.

In an embodiment, a width of the cold end is larger than a width of the thin-film thermocouple positive electrode and a width of the thin-film thermocouple negative electrode.

In an embodiment, a head width of the thin-film thermocouple positive electrode is larger than a head width of the thin-film thermocouple negative electrode.

In an embodiment, the substrate of the temperature measuring unit, the thin-film thermocouple positive electrode and the thin-film thermocouple negative electrode are respectively sputtered with a protective layer.

In an embodiment, the protective layer is made of alumina.

In a second aspect, this application provides a method for preparing the silicon carbide-based combined temperature-pressure MEMS sensor chip, comprising:

(S1) preparing a silicon carbide substrate from an N-type silicon carbide wafer;

(S2) etching a Si surface of the silicon carbide substrate to form a raised island;

(S3) epitaxially coating an insulating layer on the silicon carbide substrate, and epitaxially coating a N-type SiC layer on the insulating layer;

(S4) etching the N-type SiC layer to form four piezoresistive strips;

(S5) depositing a $SiO_2$ layer on a front side of silicon carbide substrate outside the raised island;

(S6) sputtering a metal layer onto the SiO₂ layer, and patterning the metal layer followed by annealing at high temperature to form a metal ohmic contact circuit;

(S7) spin-coating a photoresist on the raised island followed by patterning, wherein a part exposed on one half of the silicon carbide substrate is configured as a patterned part of a thin-film thermocouple positive electrode;

(S8) depositing a tungsten-rhenium alloy layer on the patterned part of the thin-film thermocouple positive electrode by magnetron sputtering to form the thin-film thermocouple positive electrode;

(S9) spin-coating a photoresist on the raised island with the thin-film thermocouple positive electrode followed by patterning wherein a part exposed on the other half of the silicon carbide substrate is configured as a patterned part of a thin-film thermocouple negative electrode.

(S10) depositing a tungsten-rhenium alloy layer on the patterned part of the thin-film thermocouple negative electrode by magnetron sputtering to form the thin-film thermocouple negative electrode; wherein a head of the thin-film thermocouple positive electrode and a head of the thin-film thermocouple negative electrode are overlapped to form a hot junction;

(S11) sputtering a protective layer onto the thin-film thermocouple positive electrode and the thin-film thermocouple negative electrode, wherein during a sputtering process of the protective layer, a thin-film thermocouple cold end is exposed; and (S12) etching the back side of the silicon carbide substrate to form a circular cavity, wherein a left material forms a pressure-sensitive diaphragm.

Compared to the prior art, the present disclosure has the following beneficial effects.

In this application, a silicon carbide MEMS pressure sensor and an ultra-high temperature thin-film thermocouple are integrated on one silicon carbide chip to form a combined temperature-pressure MEMS sensor, which not only reduces the chip manufacturing cost, but also enables the simultaneous and stable measurement of the temperature and pressure under high temperature and other extreme conditions.

The raised island and the pressure-sensitive diaphragm of the pressure measuring unit together constitute a membrane-island structure. The raised island is configured to generate a structural pressure on the pressure-sensitive diaphragm, so that when an external pressure is applied to the membrane-island structure, a larger stress is applied on the pressure-sensitive diaphragm of the pressure measuring unit outside the raised island is greater, leading to more obvious stress concentration effect on the piezoresistive strip on the pressure-sensitive diaphragm and enhancing the sensitivity of the sensor. At the same time, the raise island can prevent the pressure-sensitive diaphragm from undergoing excessive deformation under the action of external pressure, which reduces the non-linearity of the sensor. Therefore, the central membrane-island structure can effectively overcome a contradiction between the sensitivity and the non-linearity at a micro pressure, and thus makes the chip provided herein applicable to the measurement of the micro pressure and temperature at high temperature. Moreover, the membrane-island structure also enhances the measurement sensitivity.

In addition, the thin-film thermocouple electrodes of the temperature measuring unit are designed into a tortuous structure to reach a larger electrode length, which facilitates improving the reliability of temperature measurement. Simultaneously, the chip space is rationally utilized, which is beneficial to the miniaturization of the chip.

Furthermore, the raised island structure at a center of the pressure measuring unit is configured as the substrate of the temperature measuring unit, which can effectively mitigate the deformation of the substrate of the temperature measuring unit caused by pressure, thereby reducing a cross-effect of pressure on the temperature measurement.

In the preparation method provided herein, the substrate of the pressure measuring unit is etched to form the substrate of the temperature measuring unit, and the pressure measuring unit and the temperature measuring unit are produced respectively, and finally the pressure measuring unit and the temperature measuring unit are integrated on the same chip.

Figure 1:
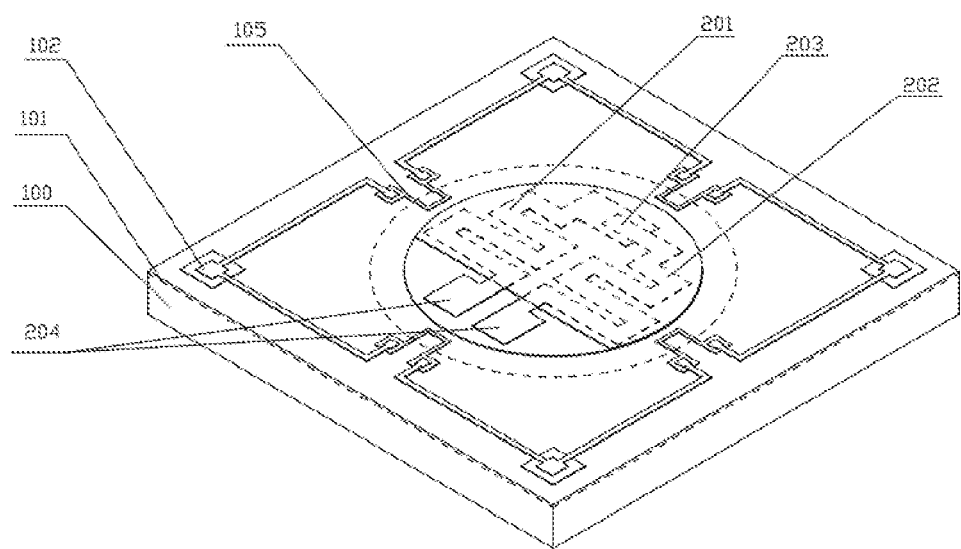
FIG. 1 is a schematic diagram of an overall structure of a chip according to an embodiment of the present disclosure.

In the drawings: 100, silicon carbide substrate; 101, insulating layer; 102, metal ohmic contact circuit; 103, cavity; 104, pressure-sensitive diaphragm; 105, piezoresistive strip; 200, raised island; 201, thin-film thermocouple positive electrode; 202, thin-film thermocouple negative electrode; 203, hot junction; 204, cold end; and 205, protective layer.

DETAILED DESCRIPTION OF EMBODIMENTS

The disclosure will be described completely and clearly below with reference to the accompanying drawings and embodiments to make the object, technical solutions, and beneficial effects of the present disclosure clearer. The embodiments provided herein are merely illustrative, and are not intended to limit the scope of the present disclosure.

As used herein, the orientation or positional relationship indicated by terms "central", "longitudinal", "transverse", "upper", "lower", "front", "back", "left", "right", "vertical", "horizontal", "top", "bottom", "inner" and "outer" is based on the orientation or positional relationship shown in the drawings, and is only for the convenience of describing the present disclosure and simplifying the description, rather than indicating or implying that the indicated device or element must have a specific orientation, or be configured and operated in a specific orientation. Therefore, these terms should not be understood as a limitation of the present disclosure.

In addition, as used herein, the terms "first", "second", etc. are only used to distinguish the elements referred to, and should not be understood as indicating or implying relative importance or implicitly indicating the number of indicated technical features. Therefore, the features defined with "first" and "second" may explicitly or implicitly include one or more of these features. As used herein, unless otherwise specified, "a plurality of" means two or more. As used herein, unless otherwise clearly specified and limited, the terms "installation", "connect" and "connection" should be understood in a broad sense, for example, it can be a fixed connection, a detachable connection or an integral connection; a mechanical connection or an electrical connection; direct connection or indirect connection through an intermediate medium; and internal communication between two components. For those of ordinary skill in the art, the specific meaning of the above terms can be understood in specific situations.

Figure 2:
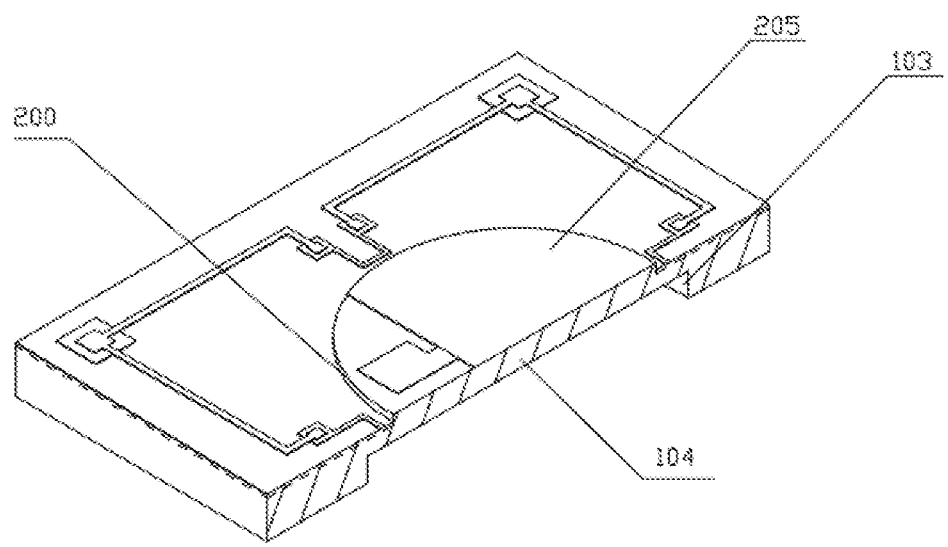
FIG. 2 is a cross-sectional view of the chip according to an embodiment of the present disclosure.
Figure 3:
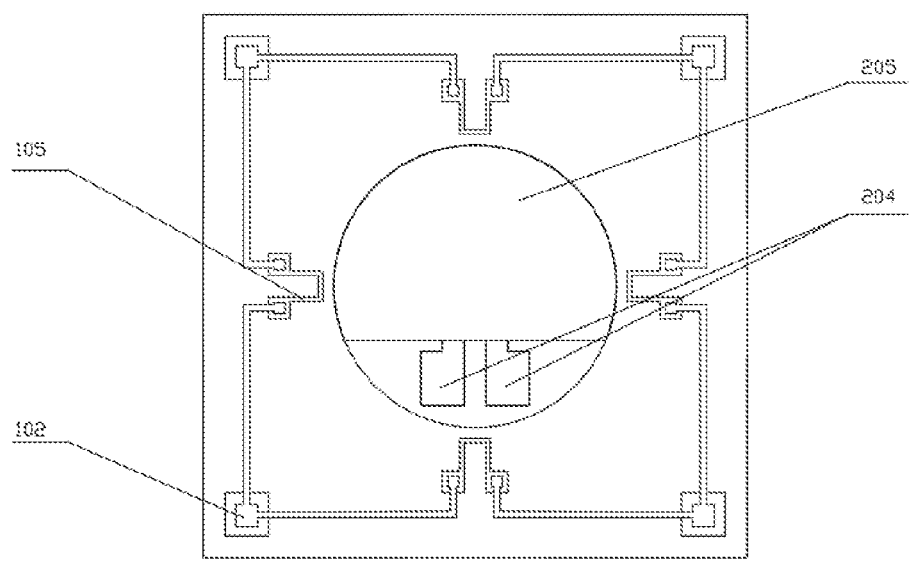
FIG. 3 is a front view of the chip according to an embodiment of the present disclosure.
Figure 4:
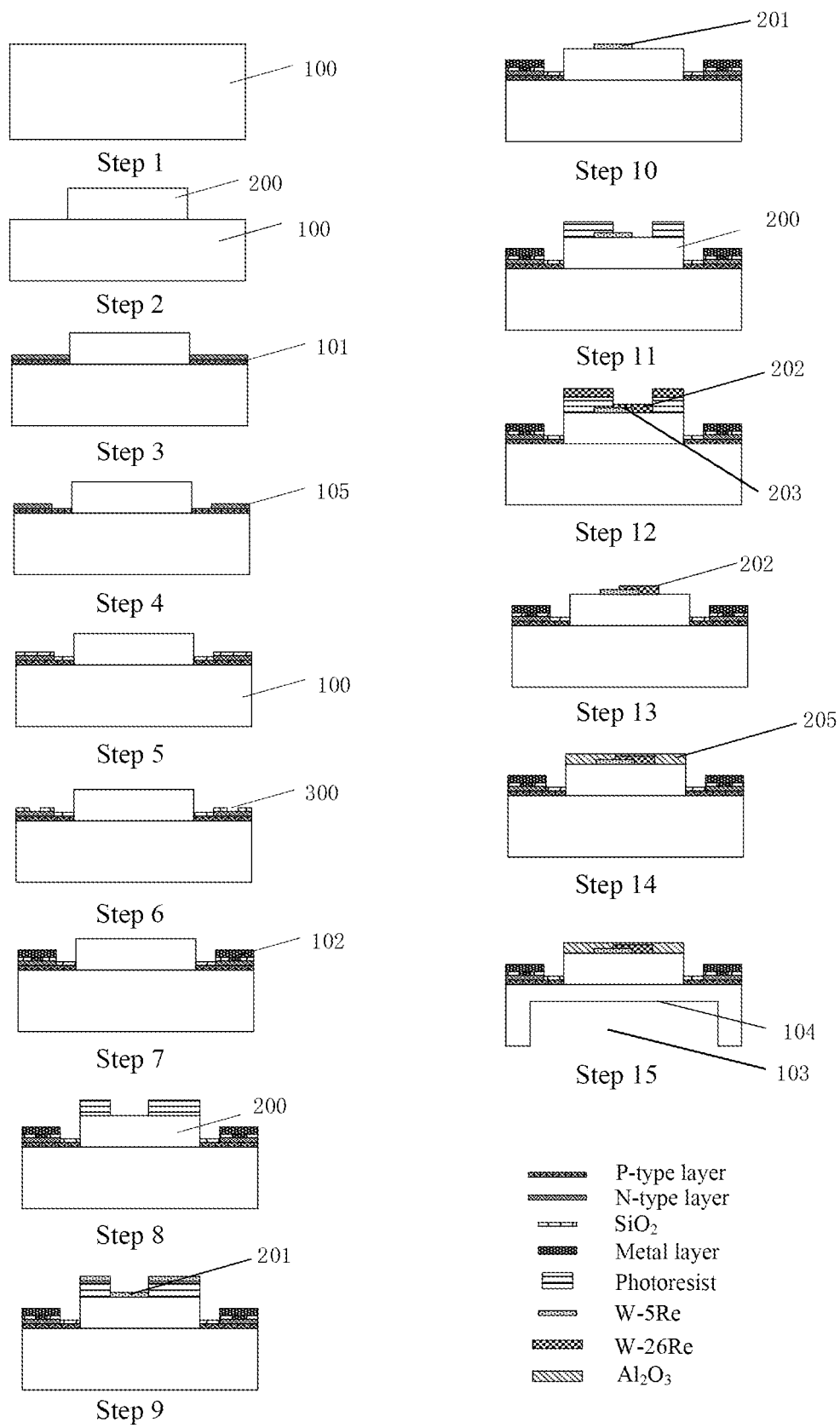
FIG. 4 is a flow chart of a preparation method of the chip according to an embodiment of the present disclosure.

Referring to an embodiment illustrated in FIG. 1-3, a silicon carbide-based combined temperature and pressure micro-electro-mechanical system (MEMS) sensor chip includes a peripheric pressure measuring unit and a central temperature measuring unit.

The peripheric pressure measuring unit includes a silicon carbide substrate 100 and an insulating layer 101 arranged on the silicon carbide substrate 100. The insulating layer 101 is provided with a metal ohmic contact circuit 102. A circular cavity 103 is arranged on a back side of the silicon carbide substrate 100. A front side of the silicon carbide substrate with the back cavity is configured as a pressure-sensitive diaphragm 104. A raised island 200 is arranged at the center just above the front side of the silicon carbide substrate. An upper end surface of the raised island 200 is higher than an upper end surface of the insulating layer 101. The raised island 200 is configured as a substrate of the temperature measuring unit. The raised island 200 and a pressure-sensitive diaphragm 104 constitute a membrane-island structure. When a pressure is applied to the membrane-island structure, a strain effect is more obvious. Four piezoresistive strips 105 are arranged symmetrically along a circumferential direction of a root of the pressure-sensitive diaphragm 104, and arranged between the raised island 200 and the pressure-sensitive diaphragm 104. A distance between a piezoresistive strip 105 and the raised island 200 is 150-200 μm, and the upper end surface of the raised island 200 is higher than an upper end surface of the piezoresistive strip 105. The four piezoresistive strips 105 are connected through the metal ohmic contact circuit 102 to form a Wheatstone bridge.

The central temperature measuring unit includes the raised island 200, a thin-film thermocouple positive electrode and a thin-film thermocouple negative electrode; the thin-film thermocouple positive electrode and the thin-film thermocouple negative electrode are arranged on the raised island 200. The thin-film thermocouple positive electrode 201 is on the left and the thin-film thermocouple negative electrode 202 is on the right. The thin-film thermocouple positive electrode 201 and the thin-film thermocouple negative electrode 202 are made from different tungsten-rhenium alloys. By contrast, the tungsten-rhenium thermocouple has a high melting point (above 3000° C.), large thermoelectric potential output, excellent sensitivity, and low cost, and thus is suitable for the temperature measurement in an ultra-high temperature environment. Due to the difference in the composition of the tungsten-rhenium alloys, the thin-film thermocouple positive electrode 201 and the thin-film thermocouple negative electrode 202 have different Seebeck coefficients to generate a thermoelectric potential. The thin-film thermocouple positive electrode 201 and the thin-film thermocouple negative electrode 202 both have a tortuous structure with equal length to obtain a larger electrode length and improve the reliability of temperature measurement. A thickness of the thin-film thermocouple positive electrode 201 is smaller than a thickness of the thin-film thermocouple negative electrode 202. A head width of the thin-film thermocouple positive electrode 201 is larger than a head width of the thin-film thermocouple negative electrode 202. The thin-film thermocouple positive electrode and the thin-film thermocouple negative electrode are overlapped to form a hot junction 203. An end pin of the thin-film thermocouple positive electrode 201 and an end pin of the thin-film thermocouple negative electrode 202 constitute a cold end 204. The cold end 204 is connected to an external circuit through a metal lead. A width of the cold end 204 is larger than a width of the thin-film thermocouple positive electrode 201 and a width of the thin-film thermocouple negative electrode 202, so as to facilitate the connection of the metal lead to the external circuit. The substrate of the temperature measuring unit, the thin-film thermocouple positive electrode 201 and the thin-film thermocouple negative electrode 202 are respectively sputtered with a protective layer 205, and the cold end 204 of the thin-film thermocouple is exposed. In an embodiment, the protective layer 205 is made of alumina.

The raised island 200 is a part of the protrusion on the pressure-sensitive diaphragm of the pressure measuring unit, and is also configured as the substrate of the temperature measuring unit. When the pressure is applied to the membrane-island structure, the produced strain effect will become more obvious.

For structural symmetry, a length of the thin-film thermocouple positive electrode 201 is to the same as a length of the thin-film thermocouple negative electrode 202, which simplifies the manufacturing process.

The thickness of the thin-film thermocouple positive electrode 201 is slightly smaller than that of the thin-film thermocouple negative electrode 202, where thin-film thermocouple positive electrode 201 is made from 95% tungsten and 5% rhenium (W-5Re), and thin-film thermocouple negative electrode 202 is made from 74% tungsten and 26% rhenium (W-26Re). Since the negative electrode (W-26Re) has a larger thermal evaporation rate than the positive electrode (W-5Re), the negative electrode is required to be slightly thicker than the positive electrode to ensure the thermoelectric characteristic of the thermocouple.

The head width of the thin-film thermocouple positive electrode is larger than the head width of the thin-film thermocouple negative electrode, which facilitates a formation of a uniform and good hot junction.

The working principle of the present disclosure is described as follows. The MEMS pressure sensor and the thin-film thermocouple are integrated on one silicon carbide MEMS chip, structurally realizing a composition of the temperature measuring unit and the pressure measuring unit, and greatly reducing the chip manufacturing cost. The pressure-sensitive diaphragm 104 of the pressure sensitive unit is designed with a raised island 200 at a center of the pressure-sensitive diaphragm 104 to form the membrane-island structure. When the sensor is in a high temperature and pressure environment, stress is generated at the piezoresistive strip 105 due to the deformation of the membrane-island. Due to the semiconductor piezoresistive effect, the resistance value of the piezoresistive strip 105 changes, breaking the balance of the Wheatstone bridge formed by the metal ohmic contact circuit 102 to produce an output voltage. The output voltage is output through the metal ohmic contact circuit 102. Since the pressure and the voltage are in a linear relationship, the pressure can be detected when the voltage is measured by the external circuit.

The temperature measurement principle of the thin-film thermocouple on the raised island 200 is based on the Seebeck effect of metal, that is, the thermoelectric effect. The positive electrode 201 of the thin-film thermocouple and the negative electrode 202 of the thin-film thermocouple are composed of alloys with different compositions, and the electrode heads are overlapped to form the hot junction 203. The end pins of the two electrodes constitute the cold end 204. The cold end 204 of the thin-film thermocouple is connected to the external circuit through the metal lead. The temperature of the cold end is set to zero through external circuit compensation. When the sensor is in a high temperature environment, the hot junction 203 and the cold end 204 are configured to form a temperature difference to generate a thermoelectric potential. The thermoelectric potential is output through the two electrode pads. The thermoelectric potential has a linear relationship with the hot junction temperature, that is, the environment temperature. The output thermoelectric potential is measured to obtain the temperature.

The pressure measuring unit and the temperature measuring unit are highly integrated on the same silicon carbide chip. When the sensor is in a high temperature and pressure environment, the membrane-island structure is configured to sense the pressure and generate a deformation, and the pressure signal is detected through the piezoresistive strip 105 and the metal ohmic contact circuit 102 and converted into an electrical signal output, and the thin-film thermocouple located on the membrane-island structure is configured to detect the temperature signal and convert the temperature signal into an electrical signal output, realizing the real-time synchronous measurement of temperature and pressure at high temperature.

A method for preparing the silicon carbide-based combined temperature-pressure MEMS sensor chip is performed through the following steps.

1) A 4-inch N-type silicon carbide wafer with a thickness of 350 μm is soaked in an acetone solution, and cleaned with ultrapure water, and dried by dehydration, then thinned to 230 μm to prepare a silicon carbide substrate 100.

2) Using a RIE shallow etching method, the front side of the silicon carbide substrate 100, that is, a Si surface, is etched to form a raised island 200, and a height of the raised island is 10-20 μm.

3) A P-type SiC layer with a thickness of 2 μm is epitaxially coated on the silicon carbide substrate 100 as an insulating layer 101, and then a N-type SiC layer with a thickness of 2 μm is epitaxially coated.

4) Four piezoresistive strips 105 are etched by shallow RIE etching on the N-type SiC layer, with an etching depth of 3 μm.

5) A $SiO_2$ layer with a thin thickness of 10-100 nm is deposited on the front of the pressure measurement unit outside the raised island 200.

6) The $SiO_2$ layer is wet etched and patterned to obtain a metal-semiconductor contact window 300.

7) A metal layer is sputtered on the front of the pressure measuring unit, then the metal layer is wet etched and patterned, and then annealed at a high temperature to form a metal ohmic contact circuit 102.

8) A photoresist is spin-coated on the raised island 200, the photoresist is patterned, wherein a part exposed on one half of the silicon carbide substrate is configured as a patterned part of a thin-film thermocouple positive electrode 201.

9) A tungsten rhenium alloy layer with 95% tungsten and 5% rhenium (W-5Re) is magnetron sputtered on the pattern part of the thin-film thermocouple positive electrode 201 to form the thin-film thermocouple positive electrode 201 with a width of 100 μm and a thickness of 1-2 μm, in a tortuous shape, a size of a pin at a bottom of the electrode is 200 μm×250 μm.

10) The photoresist and the W-5Re alloy layer on the photoresist are removed, cleaned with deionized water and dried to leave the thin-film thermocouple positive electrode 201.

11) A photoresist is spin-coated on the raised island 200 with the thin-film thermocouple positive electrode, the photoresist is patterned, wherein a part exposed on the other half of the silicon carbide substrate is configured as a pattern part of a thin-film thermocouple negative electrode 202.

12) A tungsten rhenium alloy layer made from 74% tungsten and 26% rhenium (W-26Re) is deposited on the pattern part of the thin-film thermocouple negative electrode 202 by magnetron sputtering to form the thin-film thermocouple negative electrode 202 with a width of 100 μm and a thickness of 2-5 μm, symmetrical to the thin-film thermocouple positive electrode 201. The thin-film thermocouple negative electrode 202 has a tortuous structure, and a size of a pin at a bottom of the electrode is 200 μm×250 μm, and a head of the thin-film thermocouple negative electrode 202 and a head of the thin-film thermocouple positive electrode 201 are overlapped to form a hot junction 203 with a size of 200 μm×100 μm.

13) The photoresist and the W-26Re alloy layer thereon are removed, cleaned with deionized water and dried.

14) The thin-film thermocouple is annealed at high temperature, and the thin-film thermocouple is sputtered with a protective layer 205 with a thickness of 2-3 μm. During the sputtering of the protective layer 205, a thin-film thermocouple cold end 204 is exposed.

15) A circular cavity 103 is etched on the back side of the silicon carbide substrate 100, and ICP deep etching is used to form a pressure-sensitive diaphragm 104 with a thickness of 100 μm.

16) A single temperature and pressure integrated chip is diced for subsequent sensor packaging.

A silicon carbide-based combined temperature-pressure MEMS sensor chip includes a peripheric pressure measuring unit and a central temperature measuring unit. The peripheric pressure measuring unit includes a silicon carbide substrate with a raised island and a pressure-sensitive diaphragm formed by etching the back of the silicon carbide substrate. The raised island and the pressure-sensitive diaphragm constitute a membrane-island structure. Four piezoresistive strips are arranged symmetrically along a circumferential direction of a root of the pressure-sensitive diaphragm, and arranged between the raised island and the pressure-sensitive diaphragm. The temperature-measuring unit includes the raised island as a substrate and a thin-film thermocouple arranged thereon. When a pressure is applied to the chip, the pressure measuring unit is configured to convert the pressure into an electrical signal output through the semiconductor piezoresistive effect and the Wheatstone bridge, and the temperature measuring unit is configured to convert the temperature into a thermoelectric potential output through the Seebeck effect of the metal film thermocouple to complete a real-time detection of pressure and temperature at high-temperature. The present disclosure realizes the integrated measurement of temperature and pressure at a high temperature within 600° C., and has the advantages of high temperature resistance, miniaturization, high sensitivity, excellent stability and so on.

Described above are only preferred embodiments of the present disclosure, which are not intended to limit the present disclosure. It should be understood that any modifications, replacements and improvements made by those skilled in the art without departing from the spirit and scope of the present disclosure should fall within the scope of the present disclosure defined by the appended claims.

What is claimed is:

1. A silicon carbide-based combined temperature-pressure micro-electromechanical system (MEMS) sensor chip, comprising:
a pressure measuring unit; and
a temperature measuring unit;
wherein the pressure measuring unit and the temperature measuring unit are integrated on the silicon carbide-based combined temperature-pressure MEMS sensor chip;
the pressure measuring unit comprises a silicon carbide substrate and an insulating layer arranged on the silicon carbide substrate; the insulating layer is provided with a metal ohmic contact circuit; a cavity is arranged on a back side of the silicon carbide substrate; a front side of the silicon carbide substrate with the cavity is configured as a pressure-sensitive diaphragm; a raised island is arranged above the front side of the silicon carbide substrate; the raised island is configured as a substrate of the temperature measuring unit; four piezoresistive strips are arranged along a circumferential direction of a root of the pressure-sensitive diaphragm, and arranged between the raised island and the pressure-sensitive diaphragm; and the four piezoresistive strips are connected through the metal ohmic contact circuit to form a Wheatstone bridge; and
the temperature measuring unit comprises the raised island, a thin-film thermocouple positive electrode and a thin-film thermocouple negative electrode; the thin-film thermocouple positive electrode and the thin-film thermocouple negative electrode are arranged on the raised island; a head of the thin-film thermocouple positive electrode and a head of the thin-film thermocouple negative electrode are overlapped to form a hot junction; an end pin of the thin-film thermocouple positive electrode and an end pin of the thin-film thermocouple negative electrode constitute a cold end; and the cold end is connected to an external circuit through a metal lead.

2. The silicon carbide-based combined temperature-pressure MEMS sensor chip of claim 1, wherein an upper end surface of the raised island is higher than an upper end surface of the insulating layer.

3. The silicon carbide-based combined temperature-pressure MEMS sensor chip of claim 1, wherein a length of the thin-film thermocouple positive electrode is equal to a length of the thin-film thermocouple negative electrode.

4. The silicon carbide-based combined temperature-pressure MEMS sensor chip of claim 3, wherein the thin-film thermocouple positive electrode and the thin-film thermocouple negative electrode both have a tortuous structure.

5. The silicon carbide-based combined temperature-pressure MEMS sensor chip of claim 1, wherein the thin-film thermocouple positive electrode and the thin-film thermocouple negative electrode both have a tortuous structure.

6. The silicon carbide-based combined temperature-pressure MEMS sensor chip of claim 1, wherein a width of the cold end is larger than a width of the thin-film thermocouple positive electrode and a width of the thin-film thermocouple negative electrode.

7. The silicon carbide-based combined temperature-pressure MEMS sensor chip of claim 1, wherein a head width of the thin-film thermocouple positive electrode is larger than a head width of the thin-film thermocouple negative electrode.

8. The silicon carbide-based combined temperature-pressure MEMS sensor chip of claim 1, wherein the substrate of the temperature measuring unit, the thin-film thermocouple positive electrode and the thin-film thermocouple negative electrode are respectively sputtered with a protective layer.

9. A method for preparing the silicon carbide-based combined temperature-pressure MEMS sensor chip of claim 1, comprising: (S1) preparing the silicon carbide substrate from an N-type silicon carbide wafer; (S2) etching a Si surface of the silicon carbide substrate to form the raised island; (S3) epitaxially coating the insulating layer on the silicon carbide substrate, and epitaxially coating a N-type SiC layer on the insulating layer; (S4) etching the N-type SiC layer to form four piezoresistive strips; (S5) depositing a $SiO_2$ layer on a front side of the silicon carbide substrate outside the raised island; (S6) sputtering the metal layer onto the $SiO_2$ layer, and patterning the metal layer followed by annealing to form the metal ohmic contact circuit; (S7) spin-coating a photoresist on the raised island followed by patterning, wherein a part exposed on one half of the silicon carbide substrate is configured as a patterned part of the thin-film thermocouple positive electrode; (S8) depositing a tungsten-rhenium alloy layer on the patterned part of the thin-film thermocouple positive electrode by magnetron sputtering to form the thin-film thermocouple positive electrode; (S9) spin-coating a photoresist on the raised island with the thin-film thermocouple positive electrode followed by patterning, wherein a part exposed on the other half of the silicon carbide substrate is configured as a patterned part of the thin-film thermocouple negative electrode; (S10) depositing a tungsten-rhenium alloy layer on the patterned part of the thin-film thermocouple negative electrode by magnetron sputtering to form the thin-film thermocouple negative electrode, wherein a head of the thin-film thermocouple positive electrode and a head of the thin-film thermocouple negative electrode are overlapped to form a hot junction; (S11) sputtering a protective layer onto the thin-film thermocouple positive electrode and the thin-film thermocouple negative electrode, wherein during a sputtering process of the protective layer, a thin-film thermocouple cold end is exposed; and (S12) etching the back side of the silicon carbide substrate to form a circular cavity, wherein a left material forms a pressure-sensitive diaphragm.

* * * * *